US010790217B2

(12) United States Patent
Ueda et al.

(10) Patent No.: US 10,790,217 B2
(45) Date of Patent: Sep. 29, 2020

(54) ADHESIVE FOR SEMICONDUCTOR SENSOR CHIP MOUNTING, AND SEMICONDUCTOR SENSOR

(71) Applicant: SEKISUI CHEMICAL CO., LTD., Osaka, Osaka (JP)

(72) Inventors: Saori Ueda, Kouka (JP); Yasuyuki Yamada, Kouka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 34 days.

(21) Appl. No.: 16/082,491

(22) PCT Filed: Mar. 10, 2017

(86) PCT No.: PCT/JP2017/009816
§ 371 (c)(1),
(2) Date: Sep. 5, 2018

(87) PCT Pub. No.: WO2017/155117
PCT Pub. Date: Sep. 14, 2017

(65) Prior Publication Data
US 2019/0078002 A1    Mar. 14, 2019

(30) Foreign Application Priority Data

Mar. 10, 2016  (JP) .................. 2016-047173
Mar. 10, 2016  (JP) .................. 2016-047174

(51) Int. Cl.
*H01L 29/84*      (2006.01)
*H01L 23/482*     (2006.01)
(Continued)

(52) U.S. Cl.
CPC .......... *H01L 23/4828* (2013.01); *C09J 9/02* (2013.01); *C09J 11/00* (2013.01); *C09J 11/08* (2013.01);
(Continued)

(58) Field of Classification Search
None
See application file for complete search history.

(56) References Cited

U.S. PATENT DOCUMENTS 5,483,106 A      1/1996  Echigo et al.
2009/0050266 A1  2/2009  Yang
(Continued)

FOREIGN PATENT DOCUMENTS

CN    1900195 A    1/2007
CN    1962798 A    5/2007
(Continued)

OTHER PUBLICATIONS

Supplementary European Search Report for the Application No. EP 17 763 448.2 dated Aug. 27, 2019.
(Continued)

*Primary Examiner* — Long Pham
(74) *Attorney, Agent, or Firm* — Cheng Law Group, PLLC

(57) ABSTRACT

Provided is an adhesive for semiconductor sensor chip mounting that can reduce detection of noise and can increase heat resistance and thermal cycle resistance characteristics. An adhesive for semiconductor sensor chip mounting according to the present invention is an adhesive used for mounting a semiconductor sensor chip and contains a silicone resin and a spacer, the 10% compressive elasticity modulus of the spacer being 10 N/mm² or more and 2000 N/mm² or less, the compression recovery rate of the spacer being 20% or less, and the average particle diameter of the spacer being 10 μm or more and 200 μm or less.

6 Claims, 1 Drawing Sheet

(51) Int. Cl.

| | | |
|---|---|---|
| *C09J 183/04* | (2006.01) | |
| *C09J 11/00* | (2006.01) | |
| *G01L 9/00* | (2006.01) | |
| *H01L 23/00* | (2006.01) | |
| *C09J 171/02* | (2006.01) | |
| *C09J 11/08* | (2006.01) | |
| *C09J 9/02* | (2006.01) | |
| *H01L 21/52* | (2006.01) | |
| *H01L 23/31* | (2006.01) | |
| *C08G 65/336* | (2006.01) | |

(52) U.S. Cl.
CPC ........... *C09J 171/02* (2013.01); *C09J 183/04* (2013.01); *G01L 9/00* (2013.01); *H01L 21/52* (2013.01); *H01L 23/3114* (2013.01); *H01L 24/29* (2013.01); *H01L 24/73* (2013.01); *H01L 29/84* (2013.01); *C08G 65/336* (2013.01); *C09J 2203/326* (2013.01); *H01L 24/32* (2013.01); *H01L 24/83* (2013.01); *H01L 2224/04026* (2013.01); *H01L 2224/0568* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05684* (2013.01); *H01L 2224/2612* (2013.01); *H01L 2224/2929* (2013.01); *H01L 2224/2939* (2013.01); *H01L 2224/32145* (2013.01); *H01L 2224/32225* (2013.01); *H01L 2224/83138* (2013.01); *H01L 2224/83855* (2013.01)

(56) References Cited

U.S. PATENT DOCUMENTS

| | | |
|---|---|---|
| 2009/0263936 A1 | 10/2009 | Fujisawa et al. |
| 2010/0277884 A1 | 11/2010 | Arifuku et al. |
| 2012/0085579 A1 | 4/2012 | Tatsuzawa et al. |
| 2014/0120356 A1 | 5/2014 | Shearer et al. |

FOREIGN PATENT DOCUMENTS

| | | |
|---|---|---|
| CN | 102161866 A | 8/2011 |
| CN | 102206480 A | 10/2011 |
| CN | 102533170 A | 7/2012 |
| CN | 103205231 A | 7/2013 |
| JP | 7-45642 A | 2/1995 |
| JP | 10-300772 A | 11/1998 |
| JP | 11-10782 A | 4/1999 |
| JP | 2007-322160 A | 12/2007 |
| JP | 2009-158712 A | 7/2009 |
| JP | 2011-174803 A | 9/2011 |
| JP | 2011-198953 A | 10/2011 |
| JP | 2012-4224 A | 1/2012 |
| JP | 2012-60020 A | 3/2012 |
| JP | 2015-75422 A | 4/2015 |

OTHER PUBLICATIONS

Supplementary European Search Report for the Application No. EP 17 763 449.0 dated Aug. 27, 2019.

International Search Report for the Application No. PCT/JP2017/009816 dated Apr. 11, 2017.

Written Opinion of the International Searching Authority (PCT/ISA/237) for Application No. PCT/JP2017/009816 dated Apr. 11, 2017.

International Search Report for the Application No. PCT/JP2017/009815 dated Apr. 11, 2017.

Written Opinion of the International Searching Authority (PCT/ISA/237) for Application No. PCT/JP2017/009815 dated Apr. 11, 2017.

The First Office Action for the Application No. 201780003503.6 from the State Intellectual Property Office of the People's Republic of China dated Nov. 27, 2019.

The First Office Action for the Application No. 201780003507.4 from the State Intellectual Property Office of the People's Republic of China dated Nov. 27, 2019.

Written Opinion of the International Searching Authority (PCT/ISA/237) for Application No. PCT/JP2017/009816 dated Apr. 11, 2017 (English Translation mailed Sep. 20, 2018).

Written Opinion of the International Searching Authority (PCT/ISA/237) for Application No. PCT/JP2017/009815 dated Apr. 11, 2017 (English Translation mailed Sep. 20, 2018).

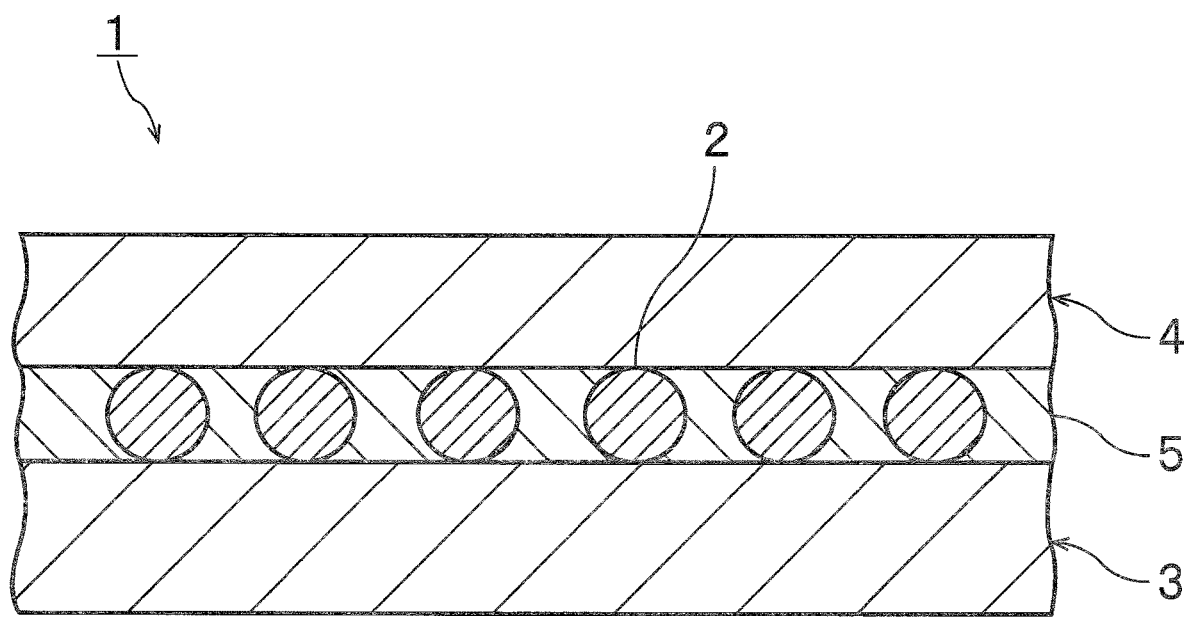

ADHESIVE FOR SEMICONDUCTOR SENSOR CHIP MOUNTING, AND SEMICONDUCTOR SENSOR

TECHNICAL FIELD

The present invention relates to an adhesive for semiconductor sensor chip mounting that is used for mounting a semiconductor sensor chip. The present invention also relates to a semiconductor sensor including the adhesive.

BACKGROUND ART

In recent years, an adhesive for bonding a semiconductor device to a substrate has been required to have heat resistance for accepting, for example, high output of the semiconductor device, and an adhesive containing a silicone resin has been proposed. Particularly a pressure sensor in the semiconductor device requires the adhesive to have performance of horizontally bonding a sensor chip to the substrate, as well as the heat resistance, and therefore an adhesive is used that contains, in addition to a silicone resin, a spacer. A sensor device including such an adhesive is disclosed in, for example, Patent Document 1.

Patent Document 1 discloses a sensor device including a first adhesive that is formed of a silicone-based resin and holds a fixed distance between a package and a circuit chip, and a second adhesive that is formed of a silicone-based resin and bonds the package to the circuit chip. The first adhesive functions as a spacer.

Patent Document 2 discloses using, as the adhesive, a silicon rubber-based resin having a spherical spacer kneaded therein in a three-axis acceleration sensor. The spherical spacer is hard plastic.

RELATED ART DOCUMENT

Patent Document

Patent Document 1: JP 2011-174803 A
Patent Document 2: JP 2007-322160 A

SUMMARY OF THE INVENTION

Problems to be Solved by the Invention

The adhesive described in Patent Document 1 is sometimes low in heat resistance. Further, the adhesive described in Patent Document 1 sometimes causes a crack and peeling by thermal shock and has low thermal cycle resistance characteristics.

The adhesive described in Patent Document 2 whose spherical spacer is hard plastic has a too sensitive stress transmission within adhesives, sometimes detecting, for example, vibration and pressure at a noise level.

An object of the present invention is to provide an adhesive for semiconductor sensor chip mounting that can reduce detection of noise and can increase heat resistance and thermal cycle resistance characteristics. Another object of the present invention is to provide a semiconductor sensor including the adhesive.

Means for Solving the Problems

According to a broad aspect of the present invention, there can be provided an adhesive for semiconductor sensor chip mounting (hereinafter, sometimes indicated as an adhesive) that is an adhesive used for mounting a semiconductor sensor chip and contains a silicone resin and a spacer, the 10% compressive elasticity modulus of the spacer being 10 N/mm$^2$ or more and 2000 N/mm$^2$ or less, the compression recovery rate of the spacer being 20% or less, and the average particle diameter of the spacer being 10 or more and 200 μm or less.

In a specific aspect of the adhesive according to the present invention, when the spacer is subjected to heating at 150° C. for 1000 hours, the ratio of the 10% compressive elasticity modulus of the spacer after the heating to the 10% compressive elasticity modulus of the spacer before the heating is 0.95 or more and 1.05 or less.

In a specific aspect of the adhesive according to the present invention, the spacer contained in the adhesive includes no spacer particles having an average particle diameter of 1.5 times or more than the average particle diameter of the spacer, or includes, in all 100% spacer particles, 0.1% or less of spacer particles having an average particle diameter of 1.5 times or more than the average particle diameter of the spacer In a specific aspect of the adhesive according to the present invention, the spacer is a silicone spacer.

In a specific aspect of the adhesive according to the present invention, the spacer is a polymer of a (meth)acrylic compound having an isobornyl group.

According to a broad aspect of the present invention, there can be provided a semiconductor sensor including a first member, a semiconductor sensor chip as a second member, and an adhesive layer that bonds the first member to the second member, the adhesive layer being a cured product of the adhesive for semiconductor sensor chip mounting.

Effects of the Invention

An adhesive for semiconductor sensor chip mounting according to the present invention contains a silicone resin and a spacer, the 10% compressive elasticity modulus of the spacer is 10 N/mm$^2$ or more and 2000 N/mm$^2$ or less, the compression recovery rate of the spacer is 20% or less, and the average particle diameter of the spacer is 10 μm or more and 200 μm or less. Thus, the adhesive for semiconductor sensor chip mounting can reduce detection of noise and can increase heat resistance and thermal cycle resistance characteristics.

BRIEF DESCRIPTION OF DRAWING

FIG. 1 is a sectional view showing one example of a semiconductor sensor including an adhesive for semiconductor sensor chip mounting according to the present invention.

MODES FOR CARRYING OUT THE INVENTION

Hereinafter, the present invention is described in detail.
[Adhesive for Semiconductor Sensor Chip Mounting]
An adhesive for semiconductor sensor chip mounting according to the present invention (hereinafter, sometimes indicated as an adhesive) is an adhesive used for mounting a semiconductor sensor chip. The adhesive according to the present invention contains a silicone resin and a spacer.

The 10% compressive elasticity modulus of the spacer is 10 N/mm$^2$ or more and 2000 N/mm$^2$ or less. The compression recovery rate of the spacer is 20% or less. The average particle diameter of the spacer is 10 μm or more and 200 μm or less.

In the present invention, the adhesive can have the specifications described above to reduce detection of noise and increase heat resistance. In addition, the adhesive can increase, as the heat resistance, adhesion strength at a high temperature. Further, in the present invention, the adhesive can have the specifications described above to increase thermal cycle resistance characteristics. In the present invention, increased is not one of the heat resistance and the thermal cycle resistance characteristics but both the heat resistance and the thermal cycle resistance characteristics.

The 10% compressive elasticity modulus is a compressive elasticity modulus when the spacer is compressed by 10%. For sufficiently reducing the detection of noise, the 10% compressive elasticity modulus of the spacer is 10 N/mm² or more and 2000 N/mm² or less. For further reducing the detection of noise, the 10% compressive elasticity modulus of the spacer is preferably 500 N/mm² or less, more preferably 100 N/mm² or less.

The 10% compressive elasticity modulus of the spacer can be measured as follows.

The spacer is compressed with a smooth flat end surface of a cylindrical indenter (diameter 50 μm, made of diamond) of a micro compression testing machine under the loading conditions of 25° C. and a maximum test load of 20 mN for 60 seconds. In the measurement, a load value (N) and a compressive displacement (mm) are measured. From the measured values obtained, the compressive elasticity modulus can be derived from the following equation. As the micro compression testing machine, there can be used, for example, "Fischerscope H100" manufactured by HELMUT FISCHER GMBH.

$$10\% \text{ compressive elasticity modulus}(N/mm^2) = (3/2^{1/2}) \cdot F \cdot S^{-3/2} \cdot R^{-1/2}$$

F: load value (N) when spacer is deformed through compression by 10%
S: compressive displacement (mm) when spacer is deformed through compression by 10%
R: radius (mm) of spacer For sufficiently increasing a gap control effect, the compression recovery rate of the spacer is 20% or less. For further increasing the gap control effect, the compression recovery rate of the spacer is preferably 15% or less, more preferably 10% or less. No lower limitation is particularly set for the compression recovery rate of the spacer, but the compression recovery rate of the spacer is usually 1% or more.

The compression recovery rate of the spacer can be measured as follows.

The spacer is sprayed on a sample stand. A load (reverse load value) is applied to one sprayed spacer particle toward the center of the spacer particle with a micro compression testing machine so that the spacer particle is deformed through compression by 30%. Subsequently, the load is released to an initial load value (0.40 mN). Loads-compressive displacements during this procedure are measured, and the compression recovery rate can be derived from the following equation. The loading rate is set to 0.33 mN/sec. As the micro compression testing machine, there can be used, for example, "Fischerscope H100" manufactured by HELMUT FISCHER GMBH.

$$\text{Compression recovery rate } (\%) = [(L1-L2)/L1] \times 100$$

L1: compressive displacement of spacer particle from initial load value to reverse load value when load is applied L2: load release displacement of spacer particle from reverse load value to initial load value when load is released The average particle diameter of the spacer is 10 μm or more and 200 μm or less. For further increasing the gap control effect, the average particle diameter of the spacer is preferably 20 μm or more, more preferably 30 μm or more and preferably 150 μm or less, more preferably 110 μm or less, further preferably 100 μm or less.

The average particle diameter is derived by observing the spacer with a scanning electron microscope and arithmetically averaging the maximum diameters of any 50 spacer particles selected in the image observed.

For further increasing the gap control effect, the content of the spacer is, in 100% by weight of the adhesive, preferably 0.1% by weight or more, more preferably 1% by weight or more and preferably 10% by weight or less, more preferably 5% by weight or less.

For further increasing the heat resistance and further suppressing continuous thermal degradation, when the spacer is subjected to heating at 150° C. for 1000 hours, the ratio of the 10% compressive elasticity modulus of the spacer after the heating to the 10% compressive elasticity modulus of the spacer before the heating (10% compressive elasticity modulus after heating/10% compressive elasticity modulus before heating) is preferably 0.95 or more, more preferably 0.98 or more and preferably 1.05 or less, more preferably 1.02 or less.

For further increasing the gap control effect, the spacer contained in the adhesive preferably includes no spacer particles having an average particle diameter of 1.5 times or more than the average particle diameter of the spacer. Alternatively, when the spacer contained in the adhesive includes spacer particles having an average particle diameter of 1.5 times or more than the average particle diameter of the spacer, the spacer includes, in all 100% spacer particles, preferably 0.1% or less of spacer particles, more preferably 0.05% or less of spacer particles having an average particle diameter of 1.5 times or more than the average particle diameter of the spacer, for further increasing the gap control effect.

For further reducing the detection of noise and further increasing the heat resistance, the spacer preferably includes a silicone resin, preferably a silicone spacer. The spacer is preferably silicone particles.

The spacer preferably includes no platinum catalyst or includes 100 ppm or less of a platinum catalyst. When a platinum catalyst is used, the smaller the content of the platinum catalyst is, the better the spacer is. A large content of the platinum catalyst is likely to decrease reliability. The content of the platinum catalyst is more preferably 80 ppm or less, much more preferably 60 ppm or less, further preferably 50 ppm or less, further more preferably 40 ppm or less, particularly preferably 30 ppm or less, further particularly preferably 20 ppm or less, most preferably 10 ppm or less.

Generally, the silicon particles are in many cases obtained by polymerizing a monomer with use of the platinum catalyst. Such silicone particles include the platinum catalyst therein even when washed, and the content of the platinum catalyst is more than 100 ppm. In contrast, silicone particles obtained without using the platinum catalyst generally do not include the platinum catalyst.

A material for the silicone particles is preferably an organopolysiloxane, more preferably a silane alkoxide. The organopolysiloxane and the silane alkoxide may be used singly or in combination of two or more organopolysiloxanes or silane alkoxides.

For further reducing the detection of noise and providing a further flexible structure, the silane alkoxide preferably includes a silane alkoxide A represented by the following formula (1A) or a silane alkoxide B represented by the following formula (1B). The silane alkoxide may include the silane alkoxide (A) represented by the following formula (1A) or may include the silane alkoxide B represented by the following formula (1B).

$$Si(R1)_n(OR2)_{4-n} \tag{1A}$$

In the formula (1A), R1 represents a hydrogen atom, a phenyl group, or an alkyl group having 1 to 30 carbon atoms, R2 represents an alkyl group having 1 to 6 carbon atoms, and n represents an integer of 0 to 2. When n is 2, a plurality of R1s may be identical or different. A plurality of R2s may be identical or different.

When R1 in the formula (1A) is an alkyl group having 1 to 30 carbon atoms, specific examples of R1 include a methyl group, an ethyl group, a propyl group, an isopropyl group, an isobutyl group, an n-hexyl group, a cyclohexyl group, an n-octyl group, and an n-decyl group. The alkyl group has preferably 10 or less carbon atoms, more preferably 6 or less carbon atoms. The alkyl group includes a cycloalkyl group.

Specific examples of R2 include a methyl group, an ethyl group, an n-propyl group, an isopropyl group, an n-butyl group, and an isobutyl group.

Specific examples of the silane alkoxide A include tetramethoxysilane, tetraethoxysilane, methyltrimethoxysilane, methyltriethoxysilane, ethyltrimethoxysilane, ethyltriethoxysilane, isopropyltrimethoxysilane, isobutyltrimethoxysilane, cyclohexyltrimethoxysilane, n-hexyltrimethoxysilane, n-octyltriethoxysilane, n-decyltrimethoxysilane, phenyltrimethoxysilane, dimethyldimethoxysilane, dimethyldiethoxysilane, diisopropyldimethoxysilane, and diphenyldimethoxysilane. A silane alkoxide other than these examples may also be used.

$$Si(R1)_n(OR2)_{4-n} \tag{1B}$$

In the formula (1B), R1 represents a hydrogen atom, a phenyl group, an alkyl group having 1 to 30 carbon atoms, or an organic group having a polymerizable double bond and 1 to 30 carbon atoms, R2 represents an alkyl group having 1 to 6 carbon atoms, and n represents an integer of 0 to 2. When n is 2, a plurality of R1s may be identical or different. A plurality of R2s may be identical or different. At least one R1, however, is an organic group having a polymerizable double bond and having 1 to 30 carbon atoms. At least one R1 is preferably a vinyl group, a styryl group, or a (meth)acryloxy group, more preferably a vinyl group or a (meth)acryloxy group, further preferably a vinyl group.

When R1 in the formula (1B) is an alkyl group having 1 to 30 carbon atoms, specific examples of R1 include a methyl group, an ethyl group, a propyl group, an isopropyl group, an isobutyl group, an n-hexyl group, a cyclohexyl group, an n-octyl group, and n-decyl group. The alkyl group has preferably 10 or less carbon atoms, more preferably 6 or less carbon atoms. The alkyl group includes a cycloalkyl group.

Examples of the polymerizable double bond include a carbon-carbon double bond. When R1 is an organic group having a polymerizable double bond and 1 to 30 carbon atoms, specific examples of $R^1$ include a vinyl group, a styryl group, an allyl group, an isopropenyl group, and a 3-(meth)acryloxyalkyl group. Examples of the styryl group include a p-styryl group, an o-styryl group, and an m-styryl group. Examples of the (meth)acryloxyalkyl group include a (meth)acryloxymethyl group, a (meth)acryloxyethyl group, and a (meth)acryloxypropyl group. The organic group having a polymerizable double bond and 1 to 30 carbon atoms has preferably 2 or more carbon atoms and preferably 30 or less carbon atoms, more preferably 10 or less carbon atoms. The term "(meth)acryloxy" denotes acryloxy and methacryloxy.

Specific examples of R2 include a methyl group, an ethyl group, an n-propyl group, an isopropyl group, an n-butyl group, and an isobutyl group.

For further reducing the detection of noise and obtaining a spacer having a further flexible structure, the silane alkoxide preferably includes dialkoxysilane.

For further reducing the detection of noise and providing a further flexible structure, a hydrolysis condensate of the silane alkoxide is preferably a hydrolysis condensate of the silane alkoxide including, in 100% by weight of the silane alkoxide, 0% by weight (unused) or more and 20% by weight or less of monoalkoxysilane, 70% by weight or more and 99.9% by weight or less of dialkoxysilane, and 0.1% by weight or more and 30% by weight or less of trialkoxysilane and tetraalkoxysilane in total, more preferably a hydrolysis condensate of the silane alkoxide including, in 100% by weight of the silane alkoxide, 0% by weight (unused) or more and 15% by weight or less of monoalkoxysilane, 75% by weight or more and 99.9% by weight or less of dialkoxysilane, and 1% by weight or more and 25% by weight or less of trialkoxysilane and tetraalkoxysilane in total.

For further easily adjusting the particle diameter, the silane alkoxide includes preferably a silane alkoxide having a polymerizable functional group, more preferably a silane alkoxide having a polymerizable double bond. Specific examples of the silane alkoxide having a polymerizable double bond include vinyltrimethoxysilane, vinyltriethoxysilane, dimethoxymethylvinylsilane, dimethoxyethylvinylsilane, diethoxymethylvinylsilane, diethoxyethylvinylsilane, ethylmethyldivinylsilane, methylvinyldimethoxysilane, ethylvinyldimethoxysilane, methylvinyldiethoxysilane, ethylvinyldiethoxysilane, p-styryltrimethoxysilane, 3-methacryloxypropylmethyldimethoxysilane, 3-methacryloxypropyltrimethoxysilane, methacryloxypropylmethyldiethoxysilane, 3-methacryloxypropyltriethoxysilane, and 3-acryloxypropyltrimethoxysilane. Alternatively, a cyclic siloxane may be used, or a modified (reactive) silicone oil may be used, for example. Specific examples of the cyclic siloxane include decamethylcyclopentasiloxane. Examples of the modified silicone oil include a one terminal-modified silicone oil, a both terminal silicone oil, and a side chain silicone oil.

A specific method of manufacturing the silicone particles is, for example, a method of condensing the silane alkoxide in advance to give an oligomer and then performing a polymerization reaction by a suspension polymerization method, a dispersion polymerization method, a miniemulsion polymerization method, or an emulsion polymerization method to prepare base material particles.

For further reducing the detection of noise and further increasing the heat resistance, the spacer is preferably a polymer that includes a polymerizable monomer having an ethylenic unsaturated group.

Examples of the polymerizable monomer having an ethylenic unsaturated group include a non-crosslinkable monomer and a crosslinkable monomer.

Examples of the non-crosslinkable monomer include, as vinyl compounds, styrene monomers such as styrene, α-methylstyrene, and chlorostyrene; vinyl ether compounds such as methyl vinyl ether, ethyl vinyl ether, propyl vinyl ether, 1,4-butanediol divinyl ether, cyclohexane dimethanol divinyl ether, and diethylene glycol divinyl ether; acid vinyl ester compounds such as vinyl acetate, vinyl butyrate, vinyl laurate, and vinyl stearate; and halogen-containing monomers such as vinyl chloride and vinyl fluoride, include, as (meth)acrylic compounds, alkyl (meth)acrylate compounds such as methyl (meth)acrylate, ethyl (meth)acrylate, propyl (meth)acrylate, butyl (meth)acrylate, 2-ethylhexyl (meth)acrylate, lauryl (meth)acrylate, cetyl (meth)acrylate, stearyl (meth)acrylate, cyclohexyl (meth)acrylate, and isobornyl (meth)acrylate; oxygen atom-containing (meth)acrylate compounds such as 2-hydroxyethyl (meth)acrylate, glycerol (meth)acrylate, polyoxyethylene (meth)acrylate, and glycidyl (meth)acrylate; nitrile-containing monomers such as (meth)acrylonitrile; and halogen-containing (meth)acrylate compounds such as trifluoromethyl (meth)acrylate and pentafluoroethyl (meth)acrylate, include, as α-olefin compounds, olefin compounds such as diisobutylene, isobutylene, linealene, ethylene, and propylene, and include, as conjugated diene compounds, isoprene and butadiene.

Examples of the crosslinkable monomer include, as vinyl compounds, vinyl monomers such as divinylbenzene, 1,4-divinyloxybutane, and divinylsulfone, include, as (meth)acrylic compounds, polyfunctional (meth)acrylate compounds such as tetramethylolmethane tetra(meth)acrylate, tetramethylolmethane tri(meth)acrylate, tetramethylolmethane di(meth)acrylate, trimethylolpropane tri(meth)acrylate, dipentaerythritol hexa(meth)acrylate, dipentaerythritol penta(meth)acrylate, glycerol tri(meth)acrylate, glycerol di(meth)acrylate, (poly)ethylene glycol di(meth)acrylate, (poly)propylene glycol di(meth)acrylate, (poly)tetramethylene glycol di(meth)acrylate, and 1,4-butanediol di(meth)acrylate, include, as allyl compounds, triallyl (iso)cyanurate, triallyl trimellitate, diallyl phthalate, diallyl acrylamide, and diallyl ether, include, as silicone compounds, silane alkoxide compounds such as tetramethoxysilane, tetraethoxysilane, methyltrimethoxysilane, methyltriethoxysilane, ethyltrimethoxysilane, ethyltriethoxysilane, isopropyltrimethoxysilane, isobutyltrimethoxysilane, cyclohexyltrimethoxysilane, n-hexyltrimethoxysilane, n-octyltriethoxysilane, n-decyltrimethoxysilane, phenyltrimethoxysilane, dimethyldimethoxysilane, dimethyldiethoxysilane, diisopropyldimethoxysilane, trimethoxysilylstyrene, γ-(meth)acryloxypropyltrimethoxysilane, 1,3-divinyltetramethyldisiloxane, methylphenyldimethoxysilane, and diphenyldimethoxysilane; polymerizable double bond-containing silane alkoxides such as vinyltrimethoxysilane, vinyltriethoxysilane, dimethoxymethylvinylsilane, dimethoxyethylvinylsilane, diethoxymethylvinylsilane, diethoxyethylvinylsilane, ethylmethyldivinylsilane, methylvinyldimethoxysilane, ethylvinyldimethoxysilane, methylvinyldiethoxysilane, ethylvinyldiethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, and 3-acryloxypropyltrimethoxysilane; cyclic siloxanes such as decamethylcyclopentasiloxane; modified (reactive) silicone oils such as a one terminal-modified silicone oil, a both terminal silicone oil, and a side chain silicone oil; and carboxyl group-containing monomers such as (meth)acrylic acid, maleic acid, and maleic anhydride.

The term "(meth)acrylate" denotes an acrylate and a methacrylate. The term "(meth)acrylic" denotes acrylic and methacrylic.

For further reducing the detection of noise and further increasing the heat resistance, the spacer is preferably a polymer of a (meth)acrylic compound, more preferably a polymer of a (meth)acrylic compound having an isobornyl group. Examples of the (meth)acrylic compound having an isobornyl group include isobornyl (meth)acrylate and isobornyl di(meth)acrylate.

The adhesive contains the spacer and the silicone resin that are described above. The spacer is preferably dispersed in the silicone resin and constitutes the adhesive. The silicone resin preferably has fluidity. The silicone resin is preferably a paste. The paste includes a liquid.

The adhesive may be a one-pack type including, for example, a main agent and a curing agent that have been mixed in advance, or a two-pack type including a main agent and a curing agent that are separate from each other. The adhesive may be a condensation curing type or an addition curing type. The adhesive may be cured with use of a catalyst such as platinum or may be cured by heating or moisture.

The silicone resin is not particularly limited. The silicone resin may be an organopolysiloxane compound, and the organopolysiloxane may have a hydroxyl group or a vinyl group at a terminal. The silicone resin may be polypropyleneoxide having a methyldimethoxysilyl group.

The adhesive may contain, in addition to the silicone resin and the spacer, a vinyl resin, a thermoplastic resin, a curable resin, a thermoplastic block copolymer, an elastomer, and a solvent, for example. These components may be used singly or in combination of two or more components.

Examples of the vinyl resin include a vinyl acetate resin, an acrylic resin, and a styrene resin. Examples of the thermoplastic resin include a polyolefin resin, an ethylene-vinyl acetate copolymer, and a polyimide resin. Examples of the curable resin include an epoxy resin, a urethane resin, a polyimide resin, and an unsaturated polyester resin. The curable resin may be a normal temperature curing resin, a thermosetting resin, a photo-curing resin, or a moisture curing resin. These curable resins may be used in combination with a curing agent. Examples of the thermoplastic block copolymer include a styrene-butadiene-styrene block copolymer, a styrene-isoprene-styrene block copolymer, a hydrogenated product of a styrene-butadiene-styrene block copolymer, and a hydrogenated product of a styrene-isoprene-styrene block copolymer. Examples of the elastomer include a styrene-butadiene copolymer rubber and an acrylonitrile-styrene block copolymer rubber.

Examples of the solvent include water and an organic solvent. An organic solvent is preferable for easy removal. Examples of the organic solvent include alcohol compounds such as ethanol, ketone compounds such as acetone, methyl ethyl ketone, and cyclohexanone, aromatic hydrocarbon compounds such as toluene, xylene, and tetramethylbenzene, glycol ether compounds such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and tripropylene glycol monomethyl ether, ester compounds such as ethyl acetate, butyl acetate, butyl lactate, cellosolve acetate, butyl cellosolve acetate, carbitol acetate, butyl carbitol acetate, propylene glycol monomethyl ether acetate, dipropylene glycol monomethyl ether acetate, and propylene carbonate, aliphatic hydrocarbon compounds such as octane and decane, and petroleum solvents such as petroleum ether and naphtha.

The adhesive may contain, in addition to the spacer and the silicone resin, a variety of additives such as a filler, an extender, a softener, a plasticizer, a polymerization catalyst, a curing catalyst, a coloring agent, an antioxidant, a thermal stabilizer, a light stabilizer, a UV absorber, a lubricant, an antistatic agent, and a flame retardant, for example.

As a method of dispersing the spacer in the silicone resin, a conventionally known dispersing method can be used, and the method is not particularly limited. Examples of the method of dispersing the spacer in the silicone resin include a method of adding the spacer into the silicone resin and then kneading the mixture with, for example, a planetary mixer for dispersion, a method of uniformly dispersing the spacer in water or an organic solvent with, for example, a homogenizer, then adding the water or organic solvent containing the spacer into the silicone resin, and kneading the mixture with, for example, a planetary mixer for dispersion, and a method of diluting the silicone resin with, for example, water or an organic solvent, then adding the spacer to the diluted silicone resin, and kneading the mixture with, for example, a planetary mixer for dispersion.

For further relieving an external impact and further preventing a crack and peeling, the content of the silicone resin is, in 100% by weight of the adhesive, preferably 70% by weight or more, more preferably 80% by weight or more and preferably 99% by weight or less, more preferably 95% by weight or less.

[Semiconductor Sensor]

A semiconductor sensor according to the present invention includes a first member, a semiconductor sensor chip as a second member, and an adhesive layer that bonds the first member to the second member. In the semiconductor sensor according to the present invention, the adhesive layer is formed of a cured product of the adhesive described above.

FIG. 1 is a sectional view showing one example of a semiconductor sensor including the adhesive for semiconductor sensor chip mounting according to the present invention.

A semiconductor sensor 1 shown in FIG. 1 includes a first member 3, a semiconductor sensor chip as a second member 4, and an adhesive layer 5 that bonds the first member 3 to the second member 4. The adhesive layer 5 is a cured product of an adhesive containing a spacer 2 and a silicone resin.

The spacer 2 is present between the first member 3 and the second member 4, so that the first member 3 is horizontally bonded to the second member 4 with a fixed interval (gap) between the members.

A method of manufacturing the semiconductor sensor is not particularly limited. As one example of the method of manufacturing the semiconductor sensor, there can be exemplified a method of disposing the adhesive between the first member and the second member to give a stacked body and then heating and pressurizing the stacked body.

Specific examples of the first member include electronic components such as a semiconductor chip, a capacitor, and a diode, and electronic components such as a circuit substrate, e.g., a printed substrate, a flexible printed substrate, a glass epoxy substrate, and a glass substrate. The first member is preferably an electronic component. The adhesive is preferably an adhesive for bonding an electronic component.

The semiconductor sensor chip is preferably a pressure sensor.

The first member may include a first electrode on a surface thereof. The second member may include a second electrode on a surface thereof. Examples of the electrodes provided on the members include metal electrodes such as a gold electrode, a nickel electrode, a tin electrode, an aluminum electrode, a copper electrode, a silver electrode, a titanium electrode, a molybdenum electrode, and a tungsten electrode. When the member is a flexible printed substrate, the electrode is preferably a gold electrode, a nickel electrode, a titanium electrode, a tin electrode, or a copper electrode. When the member is a glass substrate, the electrode is preferably an aluminum electrode, a titanium electrode, a copper electrode, a molybdenum electrode, or a tungsten electrode. When the electrode is an aluminum electrode, the electrode may be an electrode formed of only aluminum or an electrode obtained by stacking an aluminum layer on a surface of a metal oxide layer. As a material for the metal oxide layer, there can be exemplified indium oxide doped with a trivalent metal element and zinc oxide doped with a trivalent metal element. Examples of the trivalent metal element include Sn, Al, and Ga.

Hereinafter, the present invention is specifically described with reference to examples and comparative examples. The present invention is not limited to only the following examples.

(Preparation of Spacer 1)

Preparation of silicone oligomer:

Into a 100-ml separable flask installed in a hot bathtub were charged 1 part by weight of 1.3-divinyltetramethyldisiloxane and 20 parts by weight of a 0.5% by weight aqueous solution of p-toluene sulfonic acid. The mixture was stirred at 40° C. for 1 hour, and then 0.05 parts by weight of sodium hydrogen carbonate was added. Subsequently, 10 parts by weight of dimethoxymethylphenylsilane, 49 parts by weight of dimethyldimethoxysilane, 0.6 parts by weight of trimethylmethoxysilane, and 3.6 parts by weight of methyltrimethoxysilane were added to the mixture and stirred for 1 hour. Then, 1.9 parts by weight of a 10% by weigh aqueous solution of potassium hydroxide was added to the mixture, heated to 85° C., and stirred for 10 hours while decompressed with an aspirator to perform a reaction. After completion of the reaction, the mixture was returned to ordinary pressure and cooled to 40° C., and 0.2 parts by weight of acetic acid was added to the mixture and left to stand still in a separating funnel for 12 hours or more. A lower layer of the mixture that had been separated in two layers was extracted and purified with an evaporator to give a silicone oligomer.

Preparation of Silicone Particles:

A solution A was prepared by dissolving 0.5 parts by weight of tert-butyl-2-ethylperoxyhexanoate (polymerization initiator, "PERBUTYL O" manufactured by NOF CORPORATION) in 30 parts by weight of the silicone oligomer obtained. Further, an aqueous solution B was prepared by mixing with 150 parts by weight of ion-exchanged water 0.8 parts by weight of a 40% by weight aqueous solution of triethanolamine lauryl sulfate (emulsifier) and 80 parts by weight of a 5% by weight aqueous solution of polyvinyl alcohol (degree of polymerization: about 2000, degree of saponification: 86.5 to 89 mol %, "GOHSENOL GH-20" manufactured by The Nippon Synthetic Chemical Industry Co., Ltd.). Into a separable flask installed in a hot bathtub, the solution A was charged and then the aqueous solution B was added. Subsequently, a Shirasu Porous Glass (SPG) membrane (pore average diameter of about 20 μm) was used to perform emulsification. Then, the emulsified product was heated to 85° C. and polymerization was performed for 9 hours. All the particles obtained through the polymerization were washed with water by centrifugation and then subjected to classification operations to give silicone particles.

Preparation of Spacer 1:

Into a 500-ml separable flask installed in a hot bathtub were charged 6.5 parts by weight of the silicone particles obtained, 0.6 parts by weight of hexadecyltrimethylammonium bromide, 240 parts by weight of distilled water, and 120 parts by weight of methanol. The mixture was stirred at 40° C. for 1 hour, followed by addition of 3.0 parts by weight of divinylbenzene and 0.5 parts by weight of styrene, and the mixture was heated to 75° C. and stirred for 0.5 hours. Subsequently, 0.4 parts by weight of 2,2'-azobis(isobutyric acid) was added to the mixture and stirred for 8 hours for a reaction. All the particles obtained through the polymerization were washed with water by centrifugation to give a spacer 1. In the spacer 1 obtained, the average particle diameter was 20.5 μm and the CV value of the particle diameter was 3.5%.

(Preparation of Spacer 2)

A spacer 2 was obtained in the same manner as in the preparation of the spacer 1 except that a both terminal acrylic silicone oil ("X-22-2445" manufactured by Shin-Etsu Chemical Co., Ltd.) was used in place of the silicone oligomer. In the spacer 2 obtained, the average particle diameter was 20.3 μm and the CV value of the particle diameter was 3.6%.

(Preparation of Spacer 3)

A monomer mixed liquid was obtained by mixing and uniformly dissolving 100 g of ethylene glycol dimethacrylate, 800 g of isobornyl acrylate, 100 g of cyclohexyl methacrylate, and 35 g of benzoyl peroxide. A 1% by weight aqueous solution of polyvinyl alcohol in an amount of 5 kg was prepared and charged into a reaction vessel. The monomer mixed liquid was further charged into this reaction vessel and stirred for 2 to 4 hours, to adjust the particle diameter of a liquid drop of the monomer mixed liquid so that a predetermined particle diameter was given. Subsequently, a reaction was performed in a nitrogen atmosphere at 90° C. for 9 hours to give a spacer 3. The spacer 3 obtained was washed with hot water several times and then subjected to classification operations. In the spacer 3 obtained, the average particle diameter was 20.1 μm and the CV value of the particle diameter was 3.1%.

(Spacer A)

Commercially available 20 μm silica particles "Micropearl SI" (manufactured by SEKISUI CHEMICAL CO., LTD.)

(Preparation of Spacer B)

A monomer mixed liquid was obtained by mixing and uniformly dissolving 500 g of tetramethylolmethane, 500 g of divinylbenzene, and 20 g of benzoyl peroxide. A 1% by weight aqueous solution of polyvinyl alcohol in an amount of 5 kg was prepared and charged into a reaction vessel. The monomer mixed liquid was further charged into this reaction vessel and stirred for 2 to 4 hours, to adjust the particle diameter of a liquid drop of the monomer mixed liquid so that a predetermined particle diameter was given. Subsequently, a reaction was performed in a nitrogen atmosphere at 85° C. for 10 hours to give a spacer B. The spacer B obtained was washed with hot water several times and then subjected to classification operations. In the spacer B obtained, the average particle diameter was 19.8 and the CV value of the particle diameter was 3.5%.

(Preparation of Spacer C)

A monomer mixed liquid was obtained by mixing and uniformly dissolving 970 g of polytetramethylene glycol diacrylate, 30 g of tetramethylolmethane tetraacrylate, and 39 g of benzoyl peroxide. A 1% by weight aqueous solution of polyvinyl alcohol in an amount of 5 kg was prepared and charged into a reaction vessel. The monomer mixed liquid was further charged into this reaction vessel and stirred for 2 to 4 hours, to adjust the particle diameter of a liquid drop of the monomer mixed liquid so that a predetermined particle diameter was given. Subsequently, a reaction was performed in a nitrogen atmosphere at 85° C. for 9 hours to give a spacer C. The spacer C obtained was washed with hot water several times and then subjected to classification operations. In the spacer C obtained, the average particle diameter was 20.1 μm and the CV value of the particle diameter was 3.2%.

EXAMPLE 1

(Preparation of Silicone Adhesive)

The spacer 1 was, as gap control particles, added to a one-component thermally curable silicone adhesive TSE322 (manufactured by Momentive Performance Materials Inc.) so that the content of the spacer 1 became 2% by weight in an adhesive to be obtained, and was stirred with a planetary mixer for uniform dispersion. Thus, a silicone adhesive was prepared.

(Preparation of Pressure Sensor Structure)

The silicone adhesive was charged into a syringe and applied to a printed substrate with use of a dispenser so that the thickness of the adhesive became 20 μm, and a pressure sensor chip was disposed on the applied adhesive and heated at 150° C. for 10 minutes for adhesive bonding to give a pressure sensor structure.

EXAMPLE 2

A pressure sensor structure was obtained in the same manner as in Example 1 except that the spacer 2 was used in place of the spacer 1 in the preparation of the silicone adhesive.

EXAMPLE 3

A pressure sensor structure was obtained in the same manner as in Example 1 except that the spacer 3 was used in place of the spacer 1 in the preparation of the silicone adhesive.

COMPARATIVE EXAMPLE 1

A pressure sensor structure was obtained in the same manner as in Example 1 except that the spacer A was used in place of the spacer 1 in the preparation of the silicone adhesive.

COMPARATIVE EXAMPLE 2

A pressure sensor structure was obtained in the same manner as in Example 1 except that the spacer B was used in place of the spacer 1 in the preparation of the silicone adhesive.

COMPARATIVE EXAMPLE 3

A pressure sensor structure was obtained in the same manner as in Example 1 except that the spacer C was used in place of the spacer 1 in the preparation of the silicone adhesive.

(Evaluation)

(1) 10% compressive elasticity modulus The spacers were measured for the 10% compressive elasticity modulus by the method described above with use of "Fischerscope H100" manufactured by HELMUT FISCHER GMBH.

(2) Average Particle Diameter

The average particle diameter of each of the spacers was derived by observing the spacer with a scanning electron microscope and arithmetically averaging the maximum particle diameters of any 50 spacer particles selected in the image observed.

(3) Compression Recovery Rate

The spacers were measured for the compression recovery rate by the method described above with use of "Fischerscope H100" manufactured by HELMUT FISCHER GMBH.

(4) Change with Heating and Time

The spacers were measured for the 10% compressive elasticity modulus after subjected to heating in the atmosphere at 150° C. for 1000 hours with of "Fischerscope H100" manufactured by HELMUT FISCHER GMBH. The change of the spacers with heating and time was determined according to the following criteria.

[Criteria for Determining Change with Heating and Time]

◯: The ratio of the 10% compressive elasticity modulus after the heating to the 10% compressive elasticity modulus before the heating is 0.95 or more and 1.05 or less.

Δ: The ratio of the 10% compressive elasticity modulus after the heating to the 10% compressive elasticity modulus before the heating is 0.9 or more and less than 0.95, or more than 1.05 and 1.10 or less.

x: The ratio of the 10% compressive elasticity modulus after the heating to the 10% compressive elasticity modulus before the heating is less than 0.9 or more than 1.10.

(5) Heat Resistance: Connection Strength

The pressure sensor structures obtained were measured for shear strength at 260° C. The heat resistance: connection strength was determined from the shear strength.

[Criteria for Determining Heat Resistance: Connection Strength]

◯◯: The shear strength is 150 N/cm² or more.

◯: The shear strength is 100 N/cm² or more and less than 150 N/cm².

x: The shear strength is less than 100 N/cm².

(6) Thermal Cycle Resistance Characteristics

The pressure sensor structures obtained were subjected to a thermal cycle test that included as one cycle a process of retaining a sample at −40° C. for 5 minutes and then heating the sample to 120° C. and retaining the sample at 120° C. for 5 minutes and then cooling the sample to −40° C., with use of a liquid thermal shock chamber ("TSB-51" manufactured by ESPEC CORP.). After 500 cycles, the sample was collected.

The sample was observed with a stereomicroscope ("SMZ-10" manufactured by NIKON CORPORATION). Observation was conducted to check whether or not the adhesive layer caused a crack or the adhesive layer was peeled from the substrate. The thermal cycle resistance characteristics were determined according to the following criteria.

[Criteria for Determining Thermal Cycle Resistance Characteristics]

◯◯: The adhesive layer neither caused a crack nor was peeled from the substrate. ◯: The adhesive layer caused a slight crack or was slightly peeled from the substrate.

x: The adhesive layer caused a large crack or was largely peeled from the substrate.

Table 1 below shows the results.

TABLE 1

| | Type of spacer | Content of spacer (% by weight) | 10% compressive elasticity modulus of spacer before heating (N/mm²) | 10% compressive elasticity modulus of spacer after heating (N/mm²) | Change of spacer with heating and time | Average particle diameter of spacer (μm) | Compression recovery rate of spacer (%) | Heat resistance: connection strength | Thermal cycle resistance characteristics |
|---|---|---|---|---|---|---|---|---|---|
| Example 1 | 1 | 2 | 50 | 52 | ◯ | 20.5 | 7 | ◯◯ | ◯◯ |
| Example 2 | 2 | 2 | 100 | 98 | ◯ | 20.3 | 9 | ◯◯ | ◯◯ |
| Example 3 | 3 | 2 | 1600 | 1750 | Δ | 20.1 | 7 | ◯ | ◯ |
| Comparative Example 1 | A | 2 | 57330 | 57500 | ◯ | 20.3 | 76 | x | x |
| Comparative Example 2 | B | 2 | 5280 | 5650 | ◯ | 19.8 | 60 | ◯ | x |
| Comparative Example 3 | C | 2 | 2730 | 3030 | x | 20.1 | 68 | x | x |

Examples 1 to 3 demonstrated that the 10% compressive elasticity modulus of the spacer contained in the adhesive is 2000 N/mm² or less and the spacer is comparatively soft, to reduce the detection of noise in the pressure sensor structure.

EXPLANATION OF SYMBOLS

1: Semiconductor sensor
2: Spacer
3: First member
4: Second member (semiconductor sensor chip)
5: Adhesive layer

The invention claimed is:

1. An adhesive for semiconductor sensor chip mounting that is an adhesive used for mounting a semiconductor sensor chip and comprises a silicone resin and a spacer,
a 10% compressive elasticity modulus of the spacer being 10 N/mm² or more and 2000 N/mm² or less,
a compression recovery rate of the spacer being 20% or less, and
an average particle diameter of the spacer being 10 μm or more and 200 μm or less.

2. The adhesive for semiconductor sensor chip mounting according to claim 1, wherein when the spacer is subjected to heating at 150° C. for 1000 hours, a ratio of the 10% compressive elasticity modulus of the spacer after the heating to the 10% compressive elasticity modulus of the spacer before the heating is 0.95 or more and 1.05 or less.

3. The adhesive for semiconductor sensor chip mounting according to claim 1, wherein the spacer contained in the adhesive includes no spacer particles having an average particle diameter of 1.5 times or more than the average particle diameter of the spacer, or includes, in all 100% spacer particles, 0.1% or less of spacer particles having an average particle diameter of 1.5 times or more than the average particle diameter of the spacer.

4. The adhesive for semiconductor sensor chip mounting according to claim 1, wherein the spacer is a silicone spacer.

5. The adhesive for semiconductor sensor chip mounting according to claim 1, wherein the spacer is a polymer of a (meth)acrylic compound having an isobornyl group.

6. A semiconductor sensor comprising:
a first member;
a second member, the second member being a semiconductor sensor chip; and
an adhesive layer that bonds the first member to the second member,
the adhesive layer being a cured product of the adhesive for semiconductor sensor chip mounting according to claim 1.

* * * * *